(12) United States Patent
Hashimoto et al.

(10) Patent No.: US 8,262,831 B2
(45) Date of Patent: Sep. 11, 2012

(54) METHOD FOR FORMING A CIRCUIT PATTERN

(75) Inventors: Shigeo Hashimoto, Tokyo (JP); Teruyuki Hotta, Osaka (JP); Takahiro Ishizaki, Osaka (JP)

(73) Assignee: C. Uyemura & Co., Ltd., Osaka (JP)

( * ) Notice: Subject to any disclaimer, the term of this patent is extended or adjusted under 35 U.S.C. 154(b) by 204 days.

(21) Appl. No.: 12/738,794

(22) PCT Filed: Oct. 3, 2008

(86) PCT No.: PCT/JP2008/068085
§ 371 (c)(1),
(2), (4) Date: Jun. 9, 2010

(87) PCT Pub. No.: WO2009/057419
PCT Pub. Date: May 7, 2009

(65) Prior Publication Data
US 2010/0243149 A1    Sep. 30, 2010

(30) Foreign Application Priority Data
Nov. 1, 2007 (JP) ................................ P2007-285363

(51) Int. Cl.
*B29C 65/00* (2006.01)
*B32B 37/00* (2006.01)
*B32B 38/10* (2006.01)
*B32B 38/14* (2006.01)

(52) U.S. Cl. .................. 156/268; 156/272.8; 156/273.9; 156/277

(58) Field of Classification Search .................. 156/250, 156/257, 267, 272.2, 272.8, 273.5, 273.9, 156/277, 278, 268; 29/846, 829, 830, 831, 29/852; 257/40, 202, 203, 210, 211, E21.174, 257/E23.075
See application file for complete search history.

(56) References Cited

U.S. PATENT DOCUMENTS
2008/0052904 A1 * 3/2008 Schneider et al. .............. 29/846

FOREIGN PATENT DOCUMENTS
| JP | 2001-291957 | 10/2001 |
| JP | 2005-19517 | 1/2005 |
| JP | 2005-142338 | 6/2005 |

* cited by examiner

*Primary Examiner* — Sing P Chan
(74) *Attorney, Agent, or Firm* — Haverstock & Owens LLP

(57) ABSTRACT

A method for forming a circuit pattern is disclosed. A circuit pattern that forms an electrically conductive layer (2L) is formed on an insulating resin (11) that forms a first insulating layer (1L). An insulating resin (13) that forms a second insulating layer (3L) is laminated on the insulating resin (11) on which the circuit pattern has been formed. A trench (14) is formed in the laminated insulating resin (13) to expose the circuit pattern. An electroless plating metal (15) is buried by electroless plating in the trench (14) formed.

3 Claims, 3 Drawing Sheets

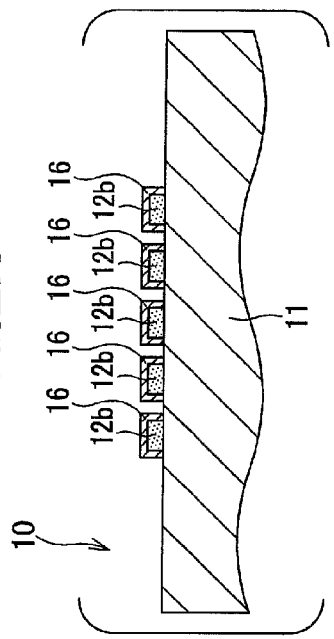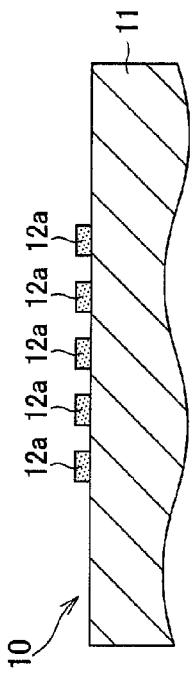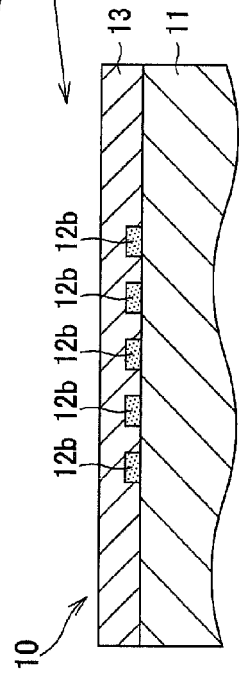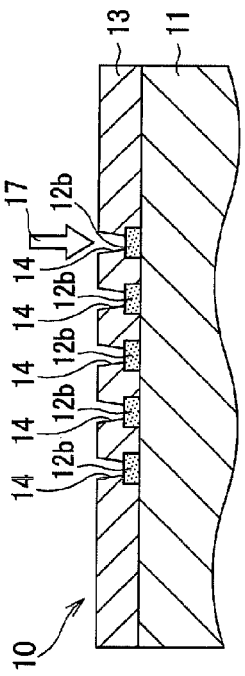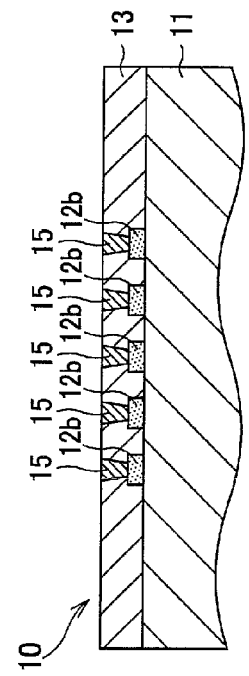

METHOD FOR FORMING A CIRCUIT PATTERN

TECHNICAL FIELD

This invention relates to a method for forming a circuit pattern and, more particularly, to a method for forming a circuit pattern that provides for high density and high miniaturization.

The present application claims priority rights based on the Japanese Patent Application 2007-285363, filed in Japan on Nov. 1, 2007. The total disclosure of the patent application of the senior filing date is to be incorporated herein by reference.

BACKGROUND ART

With the remarkable progress in the technique of the electronic industry, there is an increasing need for higher density and higher performance of a printed circuit board, and a demand for such printed circuit board is also increasing. In particular, in a motherboard for latest digital equipment, such as mobile phones, notebook computers or digital cameras, there is an increasing need for higher density and miniaturization as the motherboard is reduced in size and thickness. On the other hand, there is also an increasing need for higher connection reliability than before.

Among currently employed packaging techniques, a semi-additive method and a full additive method are most extensively used.

In the semi-additive method, a board is first coated with a catalyst. An electroless plating film then is formed as an underlying layer for current conduction for electrolytic plating. Using a plating resist exposing portions which later form a pattern for interconnections as a mask, an electrolytic plating film, which later becomes a pattern for interconnections, is formed by electroplating for circuit pattern forming.

In the full additive method, a catalyst is first coated on a board. The portions of the board, which later become a pattern of interconnections, are then exposed, using a plating resist. An electroless plating film, which later becomes a pattern for interconnections, is then formed just by electroless copper plating for circuit pattern forming.

In addition to the above mentioned packaging techniques, a packaging technique, employing an ink jet method, is stirring notice these days in order to meet the demand for high density and a fine line diameter. This ink jet method is a non-contact direct patterning technique in which ink droplets formed by metal nano-particles are sprayed and applied from an ink jet printer head to plot a pattern of interconnections. With this technique, it is unnecessary to remove electroless plating or the catalyst in the subsequent process step, in distinction from the case of the semi-additive or full additive method, thus reducing the number of the process steps. In addition, disconnections resulting from removal of electroless plating chips may be eliminated. Hence, the technique is widely used these days in order to meet the request for high density and miniaturization (see Non-Patent Publication 1, for example).

Non-Patent Publication 1: Mari SAKAI, 'Technique of Fabrication of Circuit Board by Ink-Jet Method', Journal of Society of Electronic Information Communication, vol. 90, No. 7, pp. 544-548 (2007)

Patent Publication 1: JP Patent Laid-Open Publication H11-163499

DISCLOSURE OF THE INVENTION

Problem to be Solved by the Invention

However, the above techniques, used up to now, suffer from the following problems:

For example, in the semi-additive method, the current flowing state is changed during electrical plating, as a result of which differential plating thicknesses (circuit heights) on the board may be produced. In addition, as the circuit becomes higher in density and finer in the circuit pattern, position misregistrations or defects in development are liable to be produced in forming the resist, thus possibly causing disconnections or shorting. Moreover, the electroless plating film, formed as an underlying layer for current conduction, needs to be etched off after the electroplating. This etching may cause disconnections of an essential circuit portion or may give rise to shorting.

In the full additive method, position misregistrations or defects in development are again liable to be produced in forming the resist, as the circuit becomes higher in density and finer in the circuit pattern. On the other hand, by reason of the characteristic of the full additive method, the catalyst is left below the plating resist. Hence, as the circuit is miniaturized, the catalyst, thus left over, tends to deteriorate the insulation performance across neighboring circuits, thus possibly causing the shorting. If the catalyst is etched off, disconnections of essential circuit portions may possibly be produced.

In the ink jet method, it is true that the electroless plating or the catalyst does not need to be etched off, in distinction from the case of the above mentioned semi-additive method or the full additive method. Moreover, the pattern of interconnections may be plotted without using a resist. A fine pattern of interconnections may thus be formed by a lesser number of process steps, while the problem of disconnections may also be moderated. However, in the ink jet method, an electrically conductive paste 101 that later forms a circuit pattern on an insulating resin 100, such as glass epoxy resin, is sprayed and coated to the insulating resin 100, such as glass epoxy resin, as shown in FIGS. 3A to 3C showing the process steps for the ink jet method. An electroless plating 102 then needs to be applied to a necessary thickness on the electrically conductive paste 101 which has been printed, dried and cured in order to provide for the electrical conductivity or for the electrical capacity sufficient to maintain the current supply to the interconnections. As the circuit pattern becomes miniaturized, this electroless plating 102 may grow not only in a direction normal to the board surface but also in a horizontal direction, that is, along the spacing between neighboring interconnections. There is thus raised a problem that the electroless plating 102 may be contacted with the neighboring electroless plating, thus possibly causing the shorting across neighboring circuits (see Patent Publication 1, for example).

It is an object of the present invention to overcome the above mentioned problems of the related art and to provide a circuit of a miniaturized circuit pattern free from circuit misregistrations, shorting or disconnections.

For accomplishing the above object, the present invention provides a method for forming a circuit pattern comprising a pattern forming step of forming a circuit pattern on an insulating resin, a laminating step of laminating an insulating resin layer on the insulating resin on which the circuit pattern has been formed, a trench forming step of forming a trench in the insulating resin layer laminated in the laminating step to expose the circuit pattern, and an electroless plating step of burying plating metal by electroless plating in the trench formed in the trench forming step.

BRIEF DESCRIPTION OF THE DRAWINGS

FIGS. 2A to 2D are schematic cross-sectional views showing process steps of the circuit pattern forming according to the present embodiment.

BEST MODE FOR CARRYING OUT THE INVENTION

A method for forming a circuit pattern according to an embodiment of the present invention will now be described with reference to the drawings.

Figure 1:
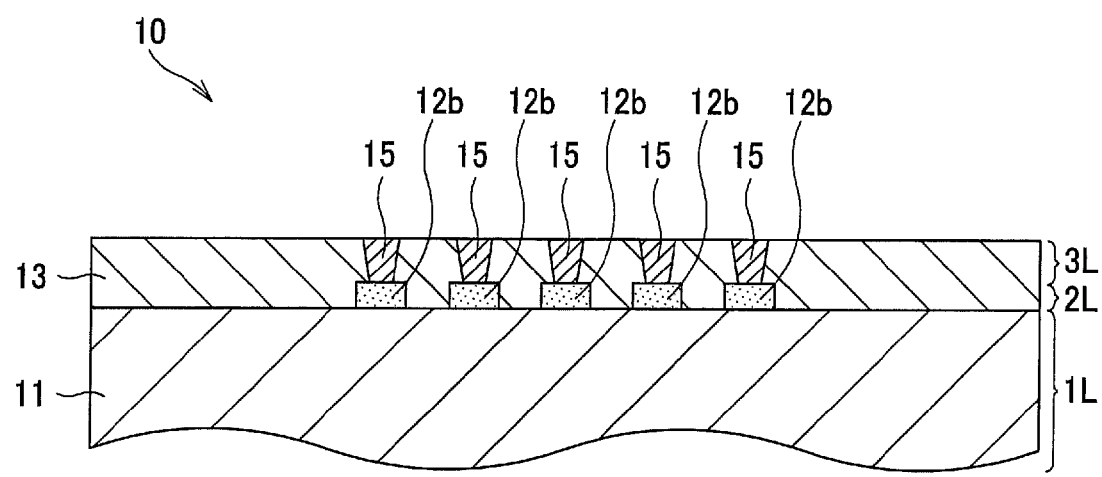
FIG. 1 is a schematic cross-sectional view showing a circuit board obtained by the method for forming a circuit pattern according to an embodiment of the present invention.
Figure 3A:
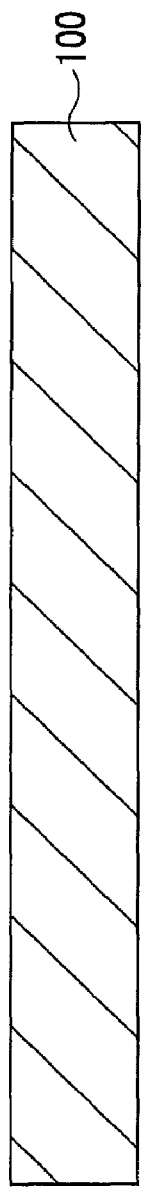
FIGS. 3A to 3C are schematic cross-sectional views showing the method for forming a circuit pattern by an ink jet method in the related art.
Figure 3B:
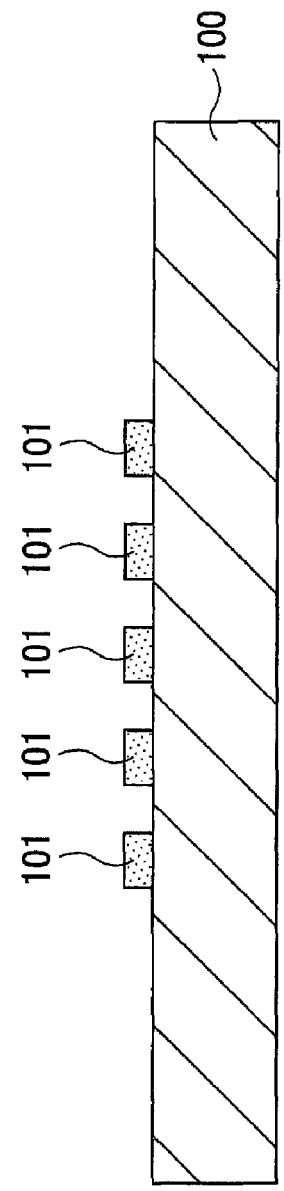
Figure 3C:
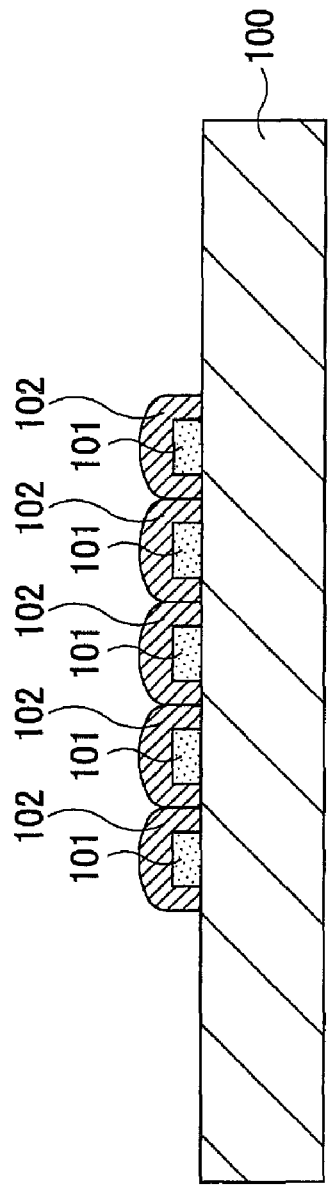

FIG. 1 depicts a cross-sectional view for illustrating schematics of a circuit board obtained by a method for forming a circuit pattern according to the present embodiment. Referring to FIG. 1, a circuit board 10 is multilayered, and is made up of a first insulating layer 1L, an electrically conductive layer 2L, and a second insulating layer 3L. The electrically conductive layer 2L is a circuit pattern formed on the first insulating layer 1L, and the second insulating layer 3L is laminated on the board on which the circuit pattern has been formed. An electroless plating metal 15 has been buried in the second insulating layer 3L so as to be electrically connected to the circuit pattern.

In preparing the circuit board 10, a circuit pattern is formed on an insulating resin 11 that is to become the first insulating layer 1L. An insulating resin 13, which is to be the second insulating layer 3L, is laminated on the insulating resin 11, on which has been formed the circuit pattern constituting the electrically conductive layer 2L. A trench is then bored in the so laminated insulating resin 13 to expose the circuit pattern. A plating metal 15 is then buried in the so formed trench by electroless plating to complete the circuit board. Referring to FIGS. 2A to 2D, the respective process steps of the method for forming a circuit pattern according to the present embodiment will now be described with reference to FIGS. 2A to 2D, which are schematic cross-sectional views showing the process steps for circuit pattern forming according to the present embodiment. Although only one side is shown in each of the cross-sectional views of FIGS. 2A to 2D, it is not intended by the present invention to exclude the processing on both sides. It should be noted that a multilayered circuit board having a larger number of layers may be provided by repeating the process steps which will be explained in detail hereinbelow.

Step of Forming a Circuit Pattern

In the method for forming a circuit pattern according to the present embodiment, a circuit pattern is initially formed on the insulating resin 11, which is to be the first insulating layer 1L, as shown in FIG. 2A.

There is no particular limitation to the insulating resin 11 which is to be the first insulating layer 1L, such that any suitable insulating resins of known sorts may be used. Examples of the resins that may be used include an epoxy (EP) resin, a polyimide (PI) resin, which is a thermosetting resin, a bis-maleimido-triazine (BT) resin, a polyphenylene ether (PPE) resin, a liquid crystal polymer (LCP), which is a thermoplastic resin, a polyether ether ketone (PEEK) resin, a polyether imide (PEI) resin, and a polyether sulfone (PES) resin. It is also possible to use a sheet of a resin-resin compound material obtained on impregnating a three-dimensional network fluorine based resin base material, such as continuously porous PTFE, with a thermosetting resin, such as an EP resin. A flexible film may also be used. By far the most preferred is such a resin which is amenable to a subsequent process step of electroless plating. For example, the resin preferably does not generate elutes harmful to a plating solution or does not produce interfacial delamination. Also, after curing and circuit pattern forming, the resin preferably exhibits sufficient adhesion to a circuit surface and to upper and lower side layers, while not being susceptible to delamination or cracking on heating/cooling test cycles. In coating an electrically conductive paste on an insulating resin to form a circuit pattern, an insulating resin, on which the electrically conductive paste is to be coated, is preferably a glass epoxy resin, a phenolic resin, a glass polyimide resin, a glass bis-maleimide resin, a glass polyphenylene oxide resin, an aramid epoxy resin or a liquid crystal polymer film, from the perspective of the tight adhesion performance relative to the electrically conductive paste. This insulating layer 11 may also be a multilayered board obtained on bonding a plurality of boards each including an electrically conductive layer.

It is on the above mentioned insulating resin 11 that the circuit pattern that forms the electrically conductive layer 2L is formed. In a method according to an embodiment of the present invention, an electrically conductive paste 12a is coated on the insulating resin 11 to form a circuit pattern. The electrically conductive paste 12a is coated at this time so that the line width/line spacing will be of desired minimum values.

It is noted that metallic particles contained in the electrically conductive paste 12a are fine particles of electrically conductive metals, selected from the group of Au, Ag, Cu, Pd, W, Ni, Ta, Bi, Pb, In, Sn, Zn, Ti and Al, or fine particles of alloys of two or more metals. In particular, the metals or alloys that may prove to be the seeds of electroless plating are preferred. These metallic particles may be synthesized by known techniques, such as alcoholic reduction, polyol reduction, thermal decomposition, ultrasonic decomposition or hydrogen reduction. The metallic particles are of a mean particle size on the order of 2 to 100 nm and, from the perspective of dispersion stability of the electrically conductive paste, are preferably metal nano particles of the mean particle size of 2 to 50 nm exhibiting high dispersion stability. To prevent cohesion of the metallic particles to one another in the paste, the metallic particles are preferably coated with an organic agent, such as amines or carboxylic acids.

The metallic particles, thus prepared, are evenly dispersed in a dispersion solvent, thereby forming an electrically conductive paste. The dispersion solvent may be exemplified by water, a polyethylene glycol monomethyl ether based solvent, a polyethylene glycol monomethyl ether acetate based solvent, a polypropylene glycol monomethyl ether based solvent, a polypropylene glycol monomethyl ether acetate based solvent, an alcoholic solvent, a hydrocarbon based solvent or an organic solvent, such as an ester or a ketone. The electrically conductive paste, thus prepared, is coated on the insulating resin 11 to form a desired shape of a targeted circuit pattern, using an ink jet method as later described, for example. The amount of the dispersion solvent used is generally 20 to 60 wt % based on the total weight of the electrically conductive paste. The amount of the solvent is preferably selected to be an optimum value depending on the desired viscosity of the electrically conductive paste. From the perspective of providing an accurate amount of injection and coating of the circuit pattern to the board, the vapor pressure of the dispersion solvent not less than 0.001 mmHg to not higher than 50 mmHg is preferred. Furthermore, additives such as curing agents, oxidation inhibitors or thickeners are contained in this electrically conductive paste to assure forming a miniaturized low-resistance circuit pattern having a high adhesion power, a smooth surface and a low resistance.

As a method for coating the electrically conductive paste 12a, thus generated, on a board of the insulating resin 11, an ink jet method, a screening method, a dispensing method, an offset method, a blade coat method, a spray coat method, a dip coat method or a spin coat method, may be used. In particular, the ink jet method, the dispensing method or the screening method is preferred. In the method for forming the circuit pattern according to the present embodiment, a circuit pattern is plotted on the insulating resin 11, using any of the above known methods. The screening method and the ink jet method may be combined together to plot the circuit pattern. In the following, the method of coating liquid droplets of the electrically conductive paste 12a on the insulating resin 11 to form the circuit pattern, using the ink jet method, will specifically be described.

The ink jet method may be classified into a piezo method that uses a piezoelectric (piezo) element as a source of pressure, and a bubble method that uses the phenomenon of liquid ebullition by heat. Any of these methods may be used for plotting the circuit pattern in the method for forming the circuit pattern of the present embodiment. Depending on the method used, the viscosity of the electrically conductive paste is optimized, or the electrically conductive paste that uses an organic solvent having an optimum boiling point is selected, in plotting the circuit pattern. An electrically conductive paste prepared is charged into a liquid sink of an ink jet printer head, and fine liquid droplets are formed. These liquid droplets are sprayed and coated on the board to give a targeted pattern shape. The mean particle size of the dots to be coated is selected, depending on the targeted values of the minimum line width/line spacing, in determining the amount of the fine liquid droplets. It is noted that, since the amount of the fine liquid droplets depends on the performance of the ink jet printer head used, such a printer head suited to the targeted amount of the liquid droplets is desirably selected and used.

After spraying and coating the electrically conductive paste 12a in this manner on the insulating resin 11, the board 10 is dried to vaporize the solvent contained in the electrically conductive paste 12a to form the board 10 on which the circuit pattern has been formed. The drying conditions may include, for example, a drying temperature of 50° C. to 200° C. and the drying time of 15 to 60 minutes. The electrically conductive paste 12a is then cured under a condition of higher temperatures. By spraying and coating the electrically conductive paste 12a on the insulating resin 11 and drying it under the high temperature condition for curing, the circuit pattern may be formed on the insulating resin 11. The process step of coating the electrically conductive paste 12a, followed by drying and further coating, may be repeated a plural number of times. Before coating the electrically conductive paste 12a, the surface of the board of the insulating resin 11 may be subjected to dry processing, such as processing by plasma, UV or corona discharge, or to wet processing, such as processing with a permanganate solution or an alkaline solution, in order to provide for facilitated spraying and coating of the electrically conductive paste 12a on the board surface. It is also possible to polish the surface of the electrically conductive paste 12a if it has been dried and cured.

Thus, in the method for forming the circuit pattern according to the present embodiment, in which the circuit pattern is formed by coating the electrically conductive paste 12a using the ink jet method, for example, the risk of voids being generated may be reduced to improve the interconnection reliability by obviating the defects in the interconnection otherwise caused by the voids. It is also possible to suppress variations in the height of the interconnections as well as to improve tight adhesion of the circuit pattern to the insulating layer 1L.

Since the circuit pattern is formed by coating the electrically conductive paste 12a using the ink jet method, for example, it is possible to suppress misregistrations of the circuit patterns or failures in development in comparison with the technique in the related art in which the circuit pattern is formed by electroplating or electroless plating. The targeted fine circuit pattern may thus be plotted more accurately.

In the following, the electrically conductive paste 12a that has been dried and cured to form the circuit pattern is termed as a conductor 12b.

In the method for forming the circuit pattern according to the present embodiment, the circuit pattern is formed by coating the electrically conductive paste 12a using e.g., the ink jet method. In the next process step, which will be described subsequently, the insulating resin 13, forming the second insulating layer 3L, is laminated on the board of the insulating resin 11 on which the circuit pattern has been formed. However, after forming the circuit pattern by the electrically conductive paste 12a, which has been dried and cured as described above, a seed layer 16 may be coated on the conductor 12b that forms the circuit pattern, for reinforcement, using e.g., the electroless plating, as necessary, as shown in FIG. 2A'. Specifically, the board 10, on which the circuit pattern has been formed by drying and curing the electrically conductive paste 12a, is processed using an acidic solution, such as sulfuric acid or hydrochloric acid. The dried and cured sites of the conductor 12b may thereby be activated and etched to raise its tight adhesion performance. The conductor 12b is coated with an electroless copper plating solution that contains copper sulfate (10 g/L) and EDTA (30 g/L) and that is adjusted to pH of 12.5 by sodium hydroxide, thereby increasing the thickness of the circuit pattern comprised of the conductor 12b. By forming the circuit pattern comprised of the conductor 12b on the board 10, and by forming the seed layer 16 by e.g. electroless plating for reinforcement, it becomes possible to prevent that the conductor 12b, forming the circuit pattern, is removed by a laser beam 17 during the subsequent step of laser processing. The desired circuit pattern may thus be formed. Although the processing employing the electroless copper plating solution has been explained above, the present invention is not limited to this processing.

Insulating Resin Laminating Process

After forming the circuit pattern, comprised of the conductor 12b that forms the electrically conductive layer 2L, on the board of the insulating resin 11 that forms the first insulating layer 1L, or after forming the circuit pattern, comprised of the conductor 12b coated with the seed layer 16 by e.g. electroless plating, the insulating resin 13, which later becomes the second insulating layer 3L, is laminated on the board 10, as shown in FIG. 2B. The insulating resin 13, thus laminated, is preferably a resin that may be worked by subsequent processing e.g. laser to form a trench therein. The insulating resin 13 is also preferably a resin having a high adherent performance with respect to the conductor 12b comprised of the electrically conductive paste 12a applied to the board 10 during the previous step. The insulating resin may be a glass epoxy resin, a phenolic resin, a glass polyimide resin, a glass bismaleimido, a glass polyphenylene oxide resin, an aramid epoxy resin or a liquid crystal polymer film.

The insulating resin 13, which is to be the second insulating layer 3L, is laminated by heating/pressuring, by known techniques, onto the insulating resin 11 of the first insulating layer 1L on which the circuit pattern has been formed. Although the condition of the temperature of 200 to 300° C. and the pressure of 10 to 60 kg/cm$^2$ may be used as an example condition for thermal compression bonding, the glass transition temperature of the insulating resin, the crystal melting temperature and so forth may desirably be taken into consideration in order to set the appropriate condition.

Trench Forming Process

After laminating the insulating resin 13 that forms the second insulating layer 3L on the board 10, on which the circuit pattern formed by the conductor 12b that forms the electrically conductive layer 2L has been formed, a trench 14 is bored in the insulating resin 13 of the second insulating layer 3L, as shown in FIG. 2C. This trench 14 exposes the conductor 12b that forms the circuit pattern. The term 'trench' herein is meant to refer both to an extended groove and to a local via, that is, an area extending from the bottom of the groove to a local contact point with an electrically conductive area below the groove bottom.

In forming the trench 14, various methods such as etching or laser processing, employing a laser processor, may be used. Preferably, the trench is formed using the laser. With the use of the laser, it is possible to promptly process to a fine shape, while it is also possible to prevent misregistrations or failures in development on light exposure that were problematic with the conventional method. A specified example with the use of the laser will now be described.

For the laser beam 17, a variety of lasers customarily used for forming fine holes, such as $CO_2$ laser, YAG laser or excimer laser, may be used. An argon laser or a helium-neon laser, which is a gas laser, a sapphire laser, which is a solid laser, may also be used. In addition, a dye laser, a semiconductor laser or a free electron laser may also be used. Preferably, an Nd-YAG laser or an excimer laser, capable of forming a finer hole, is used to form the trench. The sort of the laser used may preferably be changed depending on the size of the trench being formed.

Electroless Plating Process

Then, as shown in FIG. 2D, an electroless plating metal 15 is laminated in the trench 14 formed in the board 10 by the laser beam 17 to fill the trench 14 to provide for electrical conduction to the conductor 12b that forms a circuit pattern of the electrically conductive layer 2L. In the following, this electroless plating process will be explained in detail, beginning with a pre-process.

Initially, the processing of de-smearing is performed on the board 10 placed so that the insulating resin 13, forming the second insulating layer 3L, now carrying the trench 14 as the result of processing by the laser beam 17, will face upwards. The de-smearing processing is carried out to remove smears or the residual resin produced in forming the trench 14. For de-smearing, a well-known processing solution, such as a mixed solution of alkaline permanganate salt, composed of potassium permanganate, sodium hydroxide and ion exchange water, is used. For de-smearing, the board is immersed in a de-smearing processing solution under the temperature condition of 50 to 80° C. for 10 to 20 minutes. By removing smears or residual resins, produced in forming the trench by the laser 17, it is possible to prevent failure in current conduction between the electroless plating metal 15 charged into the trench 14 and the conductor 12b, while it is also possible to prevent deteriorated connectivity or disconnections. The processing of de-smearing may also be the physical processing of de-smearing that uses the plasma or the excimer laser.

In case an air sink has been formed in the trench 14, the processing for de-aeration may be carried out as necessary. This processing for de-aeration is performed to prevent obstruction of drug permeation into the trench 14 ascribable to the air sink.

After washing off the de-smear solutions with water from the board surface, the board is neutralized and defatted to clean the surface of the conductor 12b on the bottom of the trench 14 operating as an activated area. Specifically, the board 10 is immersed in a neutralizing solution at e.g. 45° C. for five minutes to neutralize the surface of the conductor 12b. Examples of the neutralizing solutions that may be used include those containing sulfuric acid, hydroxylamine sulfate, activating agents, organic acids and ion exchange water. In the processing for defatting, after washing the board immersed in the neutralizing solution with water, the board is immersed in a defatting solution at 65° C. for five minutes, for example, to remove oils and fats on the surface of the conductor 12b. As the defatting solution, an acidic solution or an alkaline solution may be used as desired. By the processing for neutralization and defatting, the exposed surface of the conductor 12b on the trench bottom is cleaned.

The surface of the conductor 12b that forms the exposed circuit pattern on the bottom of the trench 14 then is activated. This processing for activation is performed as the board is immersed for five to ten seconds in an acidic solution which may be a 10%-solution of sulfuric acid or hydrochloric acid. Although the acidic solution may be the 10%-solution of sulfuric acid or hydrochloric acid, a mixed solution of persulfate or sulfuric acid and hydrogen peroxide may also be used in case the circuit pattern is formed by the electrically conductive paste 12a in which copper particles are used as electrically conductive metallic particles. By immersing the board in the acidic solution in this manner, by way of acid processing, it is possible neutralize the alkali left on the surface of the conductor 12b operating as the activated area. It is thus possible to dissolve the thin oxide film and to etch (soft-etch) the surface of the conductor 12b freed of the oxide film. As a result, the electroless plating metal 15, formed in the subsequent process, may be improved in tight adhesion performance, while the surface of the conductor 12b may be activated. The activated surface of the conductor 12b on the bottom of the trench 14 is to be a start point of subsequent burial of the electroless plating metal 15. It should be noted that the bottom of the trench 14 means an exposed site on the surface of the conductor 12b in the trench even if the trench 14 is formed by the laser beam 17 from the bottom surface of the board 10 so that the surface of the conductor 12b is at an upper position.

The above mentioned process is a pre-process of the electroless plating. It should be noted that the pre-process is not limited to that described above such that any suitable different pre-processing methods may be used. The processing time and/or the drug concentration may also be changed depending on the sort of the metals used. To improve the tight adhesion performance of the electroless plating solution, the processing for roughing the surface of the conductor 12b may be performed before the processing for electroless plating. For the processing for roughing, any suitable known methods for roughing may be used.

After these pre-process steps, the processing for electroless plating of burying the electroless plating metal 15 in the trench 14 is carried out, with the pre-processed surface of the conductor 12b on the bottom of the trench 14 as a starting point, as shown in FIG. 2D.

In burying the electroless plating metal 15 in the trench 14, the plating metal 15 is charged into the trench 14 by immersing the board 10 in the electroless plating solution. The plating metal is charged into the trench 14 without coating the trench 14 with the catalyst, that is, using only of the electroless plating solution. Specifically, the plating metal 15 is charged so as to be laminated towards an opening of the trench 14, beginning from the bottom of the trench, with the activated surface of the conductor 12b as a starting point. This processing is carried out until the trench is completely filled. In burying the plating metal 15 in the trench 14, the electroless plating solution may be sprayed onto the activated surface of the conductor 12b. By so doing, the plating solution is brought into contact with the surface of the conductor 12b on the bottom of the trench 14 and laminated from the bottom towards the opening of the trench to bury the plating metal 15.

Heretofore, in burying the plating metal in the inside of the trench, the board is coated with the catalyst before the processing for electroless plating. A plating film thus is allowed to grow from the sidewall in the trench which has been coated with the catalyst. The plating metal from one trench adheres to that in the neighboring trench in the vicinity of the openings of the two trenches so that a void is produced below the openings of the trenches to cause disconnections.

In the present embodiment, just the electroless plating solution is contacted with the trench 14, without coating any portions of the trench 14, inclusive of its inner wall and bottom, with the catalyst, as described above. Hence, the electroless plating metal 15 is sequentially laminated by being allowed to grow from solely the activated surface of the conductor 12b. The plating film thus is not grown from the inner sidewall of the trench 14, coated with the catalyst, as in the method of the related art. It is possible in this manner to suppress generation of voids ascribable to overlaying of plating metal at the opening end of the trench 14, and hence to remove conduction defects or disconnections ascribable to voids, thereby improving the connection reliability.

On the other hand, there is no risk that the catalyst is left over on the insulating resin on the board to lower the insulating performance. In addition, the catalyst does not have to be removed so that it is now possible to prevent that disconnections or the like occur in the removing process.

In electroless copper plating, for example, a plating solution that uses EDTA as a chelating agent may be used as the plating solution used in the electroless plating process. An example solution of the copper plating solution is an electroless copper plating solution containing copper sulfate (10 g/L) and EDTA (30 g/L), provided that the solution is adjusted to a pH of 12.5 by sodium hydroxide. An electroless copper plating solution that uses Rochelle salt as the chelating agent may also be used. The board 10 is immersed in this electroless copper plating solution, at a temperature condition of 60 to 80° C. for 30 to 600 minutes, for example. By so doing, copper is sequentially precipitated so that it will be laminated from the bottom towards the opening of the trench 14 to bury the copper plating to fill the trench 14. In carrying out the electroless copper plating, the plating solution is sufficiently agitated to supply a sufficient amount of ions to the trench. For agitation, pneumatic stirring or circulation by pumping may be used. If plating is carried out for prolonged time, it may sometimes occur that sodium sulfate is accumulated in the plating solution to cause unusual plating precipitation. It is thus preferred to coercively take out a portion of the plating solution from time to time.

In the foregoing, the processing for electroless plating is carried out using the electroless copper plating solution. This, however, is merely illustrative, and an electroless nickel plating solution, for example, may be used as the electroless plating solution. An example composition of the nickel electroless plating solution is such a solution containing nickel sulfate (20 g/L), sodium hypophosphite (15 g/L) and a citrate (30 g/L), provided that its pH has been adjusted to 8 to 9.

In burying the trench 14 by this electroless plating, it may sometimes occur that the electroless plating metal 15 is precipitated to sites other than the inside of the trench 14. Hence, the processing for removing various sorts of the plating metal precipitates may be carried out as necessary after burying the metal in the trench 14. Specifically, the plating residues may be removed by the above mentioned processing for de-smearing, a high-pressure water washing, or by polishing In the high-pressure water washing, pressurized water may be sprayed in an amount of 50 to 70 kgs/cm$^2$ from one or both sides of the board to remove the plating residues of the plating metal. In the mechanical polishing, brushing or vibrations may be used. In the chemical polishing, a mixed solution of hydrogen peroxide water and sulfuric acid or ammonium perfsulfate may be used.

In the present embodiment, an instance of preparing a three-layered circuit board has been described. This three-layered circuit board may be prepared by laminating the electrically conductive layer 2L on the insulating resin 11 forming the first insulating layer 1L and by laminating the insulating resin 13 forming the second insulating layer 3L. The electrically conductive layer 2L is a circuit pattern formed by the electrically conductive paste 12a. It is also possible to repeat the above process a plurality of numbers of times to prepare a multilayered circuit board having an optional number of layers.

In the method for forming the circuit pattern, according to the present embodiment, a circuit pattern is formed by the electrically conductive paste 12a on the insulating resin 11 forming the first insulating layer 1L. The insulating resin 13 forming the second insulating layer 3L is then laminated, and the trench 14 is formed in the second insulating layer. The electroless plating metal 15 is laminated in the trench for providing electrical connection with the circuit pattern of the conductor 12b. This electroless plating metal 15 may assure electrical conductivity and electrical capacity necessary to conduct current between it and the circuit pattern. It is thus possible to form a circuit board of a miniaturized circuit pattern in which contacts between circuits or electrical defects such as disconnections or shorting, such as were encountered in the technique in the related art, may be prevented from occurring.

Also, in the electroless plating process of burying the plating metal 15 in the trench 14 to assure electrical conductivity and electrical capacity that are necessary, no catalyst is applied. Instead, the surface of the conductor 12b forming the circuit pattern on the bottom of the trench 14 is activated, and the plating metal 15 is laminated so as to grow only from the surface of the conductor 12b until the metal fills the trench 14. It is thus possible to prevent the void from being produced in the vicinity of the trench opening as was the case with the technique in the related art, so that a sufficient amount of the current may be reliably conducted without producing disconnections. On the other hand, non-uniformities on the circuit surface, caused by resists or plating metal, and which were produced with the conventional technique in which electroplating was used after catalyst coating, may be eliminated to prevent occurrence of disconnections or shorting ascribable to surface non-uniformities.

The present invention is not limited to the particular embodiment, described above, such that any design changes that do not depart from the scope of the present invention are comprised within the present invention.

The present invention also is not restrictively applied to the method for producing the circuit board of the above embodiment or to manufacture of a high density multilayered circuit board by the build-up technique. For example, the present invention is applied to, for example, a process for producing a multilayered wiring layer in a wafer-level CSP (Chip Size epoxy Package or Chip Scale epoxy Package) or a TCP (Tape Carrier Package).

EXAMPLES

Specified Examples of the present invention will now be described.

Example 1

An electrically conductive paste, in which electrically conductive metallic particles were copper particles, was prepared. Using this electrically conductive paste, a circuit with a minimum line width/line spacing of 10 μm/10 μm was printed on insulating resin of a build-up board, formed of an epoxy resin, using a piezo type ink jet method employing a piezo element. The board, thus prepared, was dried at 150° C. for 60 minutes to prepare a board carrying thereon the circuit pattern. A glass epoxy resin was then laminated on this board to form a plating resist.

Then, using an excimer laser processing device, manufactured by Hitachi Via Mechanics, Ltd. a trench with a minimum line width/line spacing of 10 μm/10 μm was formed so that the electrically conductive paste, printed by the previous step, will be exposed on the trench bottom.

An acidic cleaner (Thru-cup MSC, manufactured by C. Uyemura & Co., Ltd.) and a sulfuric acid based etching additive (Thru-cup MSE manufactured by C. Uyemura & Co., Ltd.) were then added to a 10%-sulfuric acid solution. The board was then immersed in the resulting solution under the condition of 35 to 44° C. for a short time duration of ca. 10 seconds to activate copper particles which are electrically conductive particles of the electrically conductive paste exposed on the trench bottom. Then, using a full-additive electroless copper plating solution (Thru-cup SP-2 manufactured by C. Uyemura & Co., Ltd.), plating was performed to a thickness of 5 μm to bury the electroless copper plating solution in the trench.

Comparative Example 1

In Comparative Example 1, the circuit pattern forming was by a semi-additive method.

That is, the surface of an insulating resin of a build-up board, formed of a glass epoxy resin, was processed with a cleaner (Thru-cup ACL-009 manufactured by C. Uyemura & Co., Ltd.), to carry out surface processing. The resulting board was then immersed in a pre-dip solution (Thru-cup PED-104 manufactured by C. Uyemura & Co., Ltd.) for three to four minutes and coated with a Pd—Sn catalyst (Thru-cup AT-105 manufactured by C. Uyemura & Co., Ltd.). The resulting board was then immersed in an accelerator (Thru-cup AL-106 manufactured by C. Uyemura & Co., Ltd.) to perform the process for catalyst coating.

The board, thus coated with the catalyst, was immersed in 30 minutes in a semi-additive electroless copper plating solution containing rochelle salt as a chelating agent (Thru-cup PEA manufactured by C. Uyemura & Co., Ltd.). In this manner, an electroless copper plating film as an underlying layer for current conduction for electroplating was formed.

On the electroless copper plating film was formed a plating resist pattern of a minimum line width/line spacing of 10 μm/10 μm. The resulting board was then immersed in a copper electroplating solution for via filling (Thru-cup EVF manufactured by C. Uyemura & Co., Ltd.) to carry out electroplating to form a copper circuit.

Comparative Example 2

In Comparative Example 2, a circuit was prepared by a full additive method.

That is, the surface of an insulating resin layer of a build-up board, formed of a glass epoxy resin, was processed with a cleaner (Thru-cup ACL-009 manufactured by C. Uyemura & Co., Ltd.), to carry out surface processing. The resulting board was immersed in a pre-dip solution (Thru-cup PED-104 manufactured by C. Uyemura & Co., Ltd.) for three to four minutes, and was then coated with a Pd—Sn catalyst (Thru-cup AT-105 manufactured by C. Uyemura & Co., Ltd.). The resulting board was then immersed in an accelerator (Thru-cup AL-106 manufactured by C. Uyemura & Co., Ltd.) for five to ten minutes by way of performing the process for catalyst coating.

A plating resist, which is to become an interconnection pattern, was then formed on the board coated with the catalyst. The Pd catalyst was then activated, using an acidic cleaner (Thru-cup MSC and Thru-cup MSE manufactured by C. Uyemura & Co., Ltd.), 10%-sulfuric acid and a reducer (AL-cup reducer MAB manufactured by C. Uyemura & Co., Ltd.).

On the board, with the catalyst activated, a copper circuit, having a thickness of 10 μm, was formed using a full-additive copper electroless plating solution (Thru-cup SP-2 manufactured by C. Uyemura & Co., Ltd.), just by electroless copper plating.

Comparative Example 3

An electrically conductive paste, whose electrically conductive metal particles were copper particles, was prepared. A circuit with a minimum line width/line spacing of 10 μm/10 μm was printed on an insulating resin layer of a glass epoxy resin of a build-up board, using an ink jet method of the piezo type that uses a piezo element. The resulting product was dried at 100° C. for 60 minutes to prepare a board on which a circuit pattern has been formed.

An acidic cleaner (Thru-cup MSC manufactured by C. Uyemura & Co., Ltd.) and a sulfuric acid based etching additive (Thru-cup MSE manufactured by C. Uyemura & Co., Ltd.) were then added to a 10%-sulfuric acid solution. The board was then immersed in the resulting solution under the temperature condition of 35 to 44° C. for a short time duration of ca. 10 seconds to activate copper particles which are electrically conductive particles of the electrically conductive paste that forms the circuit pattern. Then, using a full-additive electroless copper plating solution (Thru-cup SP-2 manufactured by C. Uyemura & Co., Ltd.), plating to a thickness of 5 μm was performed on this electrically conductive paste.

The respective circuit boards, obtained with the above Example 1 and the Comparative Examples 1 to 3, were checked as to inspection of shorting, inspection of disconnections, misregistrations of circuit patterns/development defects, and as to measurement of insulating properties. Specifically, the resistance across both ends of the circuit was measured using a mΩ-Hi TESTER manufactured by HIOKI E.E. CORPORATION. For example, if, in inspecting the disconnections, the resistance becomes higher, it is determined that disconnections occurred in the circuit under test. If, in inspecting the shorting, the resistance becomes lower, it is determined that shorting occurred in the circuit under test. As to misregistration/development defect of the circuit, a decision was given on the basis of non-contact inspection in accordance with an optical appearance system with the use of a line sensor. As to the lowering of the insulation properties, if the resistance is lowered, it was determined that the insulation properties were lowered. The test results are summarized in the following Table 1:

|  | shorting | disconnections | circuit misregistration/ development defects | lowered insulation properties |
|---|---|---|---|---|
| Ex. 1 | ○ | ○ | ○ | ○ |
| Comp. Ex. 1 | x | x | x | Δ |
| Comp. Ex. 2 | Δ | x | x | x |
| Comp. Ex. 3 | x | ○ | ○ | ○ |

In the above Table, ○ denotes that no defect indicated occurred such that the circuit board samples were acceptable, while × indicates that, in inspection and measurement of a plurality of board samples, the defect indicated occurred in a majority of the board samples, such that the circuit board samples tested were rejects. On the other hand, Δ in the Table indicates that, in inspection and measurement of a plurality of board samples, the defect indicated occurred in a fraction of the board samples.

It is seen from the results of the inspection, summarized in Table 1, that, in the circuit board sample, obtained by Example 1, to which the method for forming the circuit pattern of the present embodiment is applied, no contact or bleeding occurred between the neighboring circuits. Moreover, no failure in conduction, such as shorting or disconnection, occurred in the circuit board sample, thus indicating that a sufficient electrical capacity could be maintained. In addition, there occurred no misregistrations of the circuit patterns, while the insulating properties in the insulating layers were not lowered.

Conversely, in Comparative Example 1, there occurred disconnections, possibly ascribable to removal of the electroless copper plating. In addition, shorting occurred in certain board samples. The plating resist suffered from development defects in many board samples, while non-uniformities were noticed in certain board samples. In Comparative Example 2, misregistrations in the plating resists were noticed, while the lowering of the insulating properties due to the residual catalysts was also noticed. Shorting or disconnections possibly ascribable to the lowered insulating properties also occurred. In Comparative Example 3, disconnections, circuit misregistrations or lowered insulating properties were not noticed. However, shorting occurred possibly due to contact of the electroless copper plating, applied to cover a circuit formed by the electrically conductive paste dried and cured to provide for an electrical capacity, with the electroless copper plating applied to cover another circuit.

It is seen from the above results that, in distinction from the conventional method for forming the circuit pattern, the method for forming the circuit pattern of the present embodiment is free from electrical defects, such as disconnections or shorting across neighboring circuits. In addition, with the present method for forming the circuit pattern, it is possible to form circuit patterns of fine design rule and to provide a circuit board of high connection reliability capable of coping with a request for higher density and for finer lines.

The invention claimed is:

1. A method for forming a circuit pattern comprising:
a pattern forming step of forming a circuit pattern on an insulating resin by coating and curing an electrically conductive paste by an ink jet system;
a seed layer forming step of forming a seed layer by electroless plating on the cured electrically conductive paste that forms the circuit pattern;
a laminating step of laminating an insulating resin layer on the insulating resin on which the circuit pattern has been formed;
a trench forming step of forming a trench in the insulating resin layer laminated in the laminating step to expose the circuit pattern; and
an electroless plating step of burying plating metal by electroless plating in the trench formed in the trench forming step.

2. The method for forming a circuit pattern according to claim 1 wherein, in the trench forming step, the trench is formed by laser.

3. The method for forming a circuit pattern according to claim 1, wherein in the electroless plating step, electroless plating metal is laminated in the absence of a catalyst on the bottom of the trench and thence towards an opening end of the trench to fill the trench.

* * * * *